(12) United States Patent
Razavi et al.

(10) Patent No.: US 7,084,707 B2
(45) Date of Patent: Aug. 1, 2006

(54) LOW NOISE AMPLIFIER AND RELATED METHOD

(75) Inventors: Behzad Razavi, Los Angeles, CA (US); Han-Chang Kang, Taipei Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 22 days.

(21) Appl. No.: 10/711,538

(22) Filed: Sep. 24, 2004

(65) Prior Publication Data

US 2006/0066410 A1    Mar. 30, 2006

(51) Int. Cl.
*H03F 3/04* (2006.01)

(52) U.S. Cl. .................. 330/302; 330/129; 330/311

(58) Field of Classification Search .............. 330/302, 330/129, 51, 311
See application file for complete search history.

(56) References Cited

U.S. PATENT DOCUMENTS

| | | | |
|---|---|---|---|
| 3,883,815 A * | 5/1975 | Grundy ..................... | 330/302 |
| 6,215,355 B1 * | 4/2001 | Meck et al. ............... | 330/51 |
| 6,232,841 B1 * | 5/2001 | Bartlett et al. ............. | 330/305 |
| 6,724,259 B1 * | 4/2004 | Tanabe ...................... | 330/285 |
| 6,806,777 B1 * | 10/2004 | Franca-Neto ............... | 330/311 |
| 6,825,722 B1 * | 11/2004 | Segawa ..................... | 330/254 |
| 6,940,358 B1 * | 9/2005 | Meacham .................. | 331/117 R |
| 6,963,241 B1 * | 11/2005 | Lindell ..................... | 330/124 R |

OTHER PUBLICATIONS

Behzad Razavi, Low-Noise Amplifiers and Mixers, RF Microelectronics, Nov. 06, 1997, pp. 166-205, Prentice Hall PTR., NJ.

* cited by examiner

*Primary Examiner*—Patricia Nguyen
(74) *Attorney, Agent, or Firm*—Winston Hsu

(57) ABSTRACT

A low noise amplifier (LNA) for filtering an input signal to generate an output signal. The low noise amplifier includes a switched loading circuit having a plurality of loading units, each of the loading units determining a corresponding center frequency of the low noise amplifier. The switched loading circuit selectively enables a loading unit having the desired corresponding center frequency. At least one converters coupled to the switched loading circuit converts a voltage of the input signal into a loading current and passes the loading current through the enabled loading unit to generate the output signal.

28 Claims, 2 Drawing Sheets

LOW NOISE AMPLIFIER AND RELATED METHOD

BACKGROUND OF INVENTION

1. Field of the Invention

The present invention relates to a low noise amplifier, and more particularly to a low noise amplifier and related method in a wideband communication system.

2. Description of the Prior Art

A low noise amplifier (LNA) is a common device used to filter out the noise of input signals received at the front ends of communication systems. Generally speaking, the LNA is capable of decreasing most of the incoming noise and amplifying a desired signal within a certain frequency range to increase the signal to noise ratio (SNR) of the communication system and improve the quality of received signal as well. Because the desired signal is transmitted via a carrier, the frequency range of the desired signal is supposed to be near the carrier frequency. Therefore, the LNA is designed to magnify an input signal with a frequency close to the carrier frequency and attenuate an input signal with a frequency far away from the carrier frequency through a common gate or common source amplifier with a frequency-dependent loading, such as an inductor connected to a capacitor in parallel.

Please refer to FIG. 1, which is a schematic diagram illustrating the frequency response 10 of a prior art narrow-band LNA. Taking the narrow-band LNA of a wireless communication system for example, the frequency response 10 of the LNA has a center frequency of 2.43 GHz and a bandwidth about 200 MHz. As one can see, an input signal with a frequency equaling 2.43 GHz is allowed to have a maximum magnitude value processed by the LNA. However, because of the characteristics of the loading formed by the inductor and the capacitor connected in parallel, an input signal with a frequency deviated from 2.43 GHz is attenuated via the LNA, and is completely filtered out if its frequency is located outside the allowed bandwidth 2.42–2.44 GHz. Please note that the combination of the inductor and the capacitor determines the center frequency and the operating bandwidth associated with the frequency response 10 shown in FIG. 1.

However, this kind of LNA is not applicable in a wideband communication system especially when the wideband communication system uses a high-frequency carrier to transfer data. Concerning an ultra-wideband (UWB) communication system, it requires an LNA having a great bandwidth from 10 GHz to 66 GHz. Therefore, the combination of the inductor and the capacitor according to the prior art narrow-band LNA is unable to generate a frequency response with such a great bandwidth. However, if a prior art wide-band LNA is adopted, much of the undesired noise could not be successfully suppressed through a single filtering bandwidth, and is injected into the ultra-wideband communication system, which degrades the signal quality.

SUMMARY OF INVENTION

It is therefore one of the objectives of the claimed invention to provide a low noise amplifier with a switched bandwidth instead of a fixed bandwidth, to solve the above-mention problem.

According to the claimed invention, a low noise amplifier is disclosed. The low noise amplifier includes a switched loading circuit having a plurality of loading units, each of the loading units determining a corresponding center frequency of the low noise amplifier. The switched loading circuit selectively enables a loading unit having the corresponding center frequency. At least one converter coupled to the switched loading circuit converts the input signal into a loading current and passes the loading current through the enabled loading unit to generate the output signal.

In addition, the claimed invention discloses a low noise amplifying method for filtering an input signal to generate an output signal. The low noise amplifying method includes providing a plurality of loading units, each of the loading units determining a corresponding center frequency. A loading unit corresponding to the desired center frequency is selectively enabled. The input signal is converted into a loading current and the loading current is passed through the enabled loading unit to generate the output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
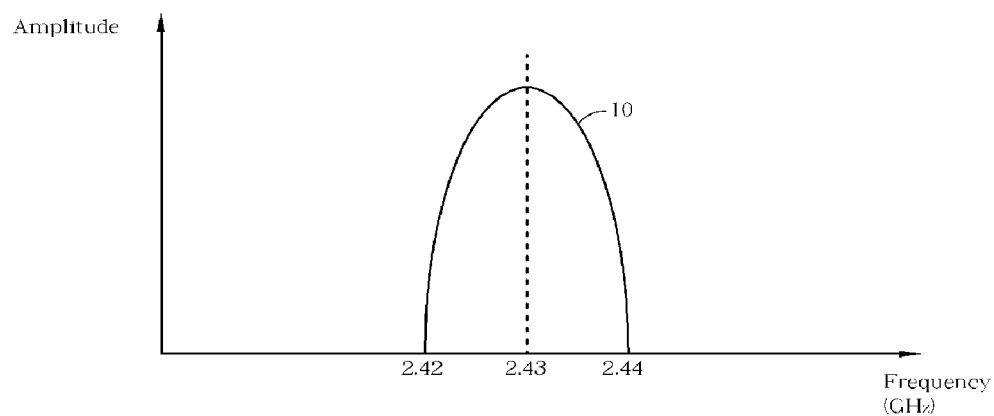
FIG. 1 is a schematic diagram of a frequency response of a prior art low noise amplifier.
Figure 2:
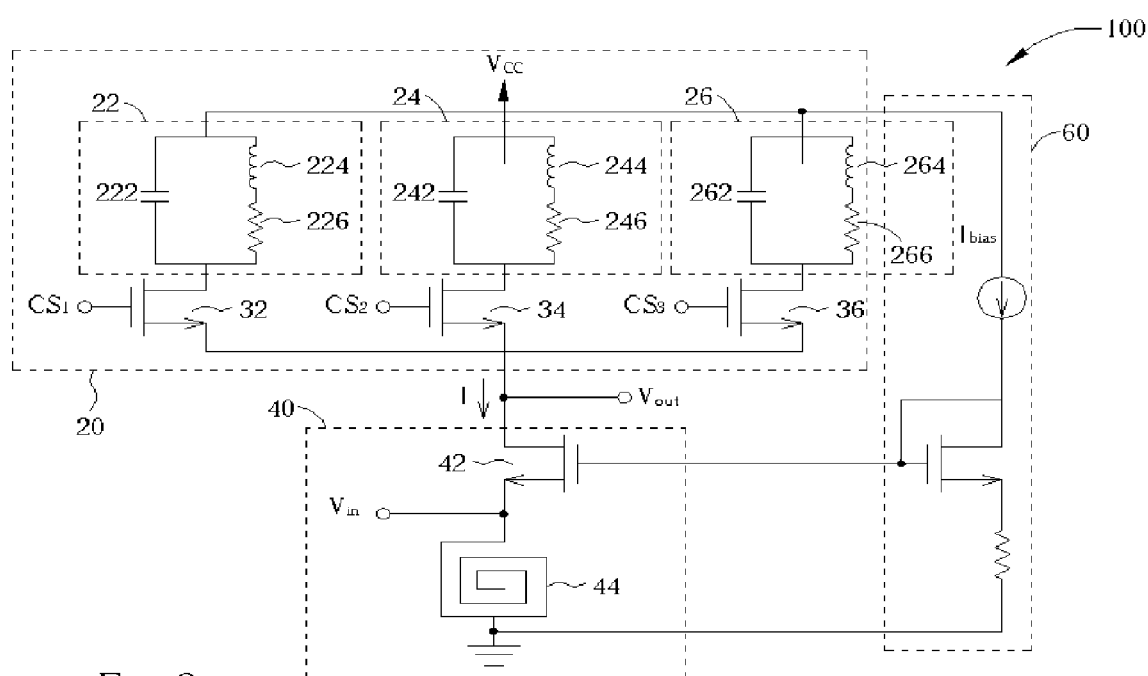
FIG. 2 is schematic diagram of a low noise amplifier according to the present invention.

Please refer to FIG. 2, which is schematic diagram of a low noise amplifier (LNA) 100 according to an embodiment of the present invention. In this embodiment, the LNA 100 is applied to a wideband communication system (e.g. an ultra-wideband communication system). The LNA 100 includes a switched loading circuit 20, a voltage to current transformer 40, and a bias circuit 60. The switched loading circuit 20 is used to provide a switched loading in order to tune a desired center frequency and a desired bandwidth. As shown in FIG. 2, the switched loading circuit 20, in this embodiment, contains three loading units 22, 24, 26, and three switches 32, 34, 36. NMOS transistors implement all of the switches 32, 34, 36, respectively. However, it is well-known that an NMOS transistor or a PMOS transistor can be adopted to function as a transistor switch. The implementation of the switches 32, 34, 36 shown in FIG. 2 is only meant to serve as an example and is not meant to be taken as a limitation.

As one can see, the switch 32 is turned on if the logic level of the control signal $CS_1$ is "high", and is turned off if the logic level of the signal $CS_1$ is "low". Similarly, the switch 34 is turned on if the logic level of the control signal $CS_2$ is "high" and is turned off if the logic level of the signal $CS_2$ is "low". The switch 36 is turned on if the logic level of the control signal $CS_3$ is "high" and is turned off if the logic level of the signal $CS_3$ is "low". Therefore, if the control signals $CS_1$, $CS_2$, $CS_3$ are controlled to have logic levels respectively corresponding to "high", "low", "low", the loading unit 22 is selected and enabled to provide a specific loading for the LNA 100. In the same way, each of the loading units 24, 26 is selected and enabled through pulling "high" the corresponding control signal $CS_2$, $CS_3$. So, the LNA 100 according to the present invention can select a desired loading unit based on the requirements for the gain, the center frequency, and the bandwidth. As for the electrical structure of the loading units 22, 24, 26, it is further disclosed in the following paragraph.

The loading units 22, 24, 26 shown in FIG. 2 correspond to a plurality of impedance $Z_1$, $Z_2$, $Z_3$ respectively. As one can see, the loading unit 22 includes a capacitor 222, an inductor 224, and a resistor 226. Similarly, the loading unit 24 includes a capacitor 242, an inductor 244, and a resistor 246, and the loading unit 26 includes a capacitor 262, an inductor 264, and a resistor 266. The inductors 224, 244, 264 connected to the respective resistor 226, 246, 266 in series and connected to the respective capacitor 222, 242, 262 in parallel can implement each of the impedances. Therefore, the mathematical model of the impedance $Z_1$, $Z_2$, $Z_3$ is shown as follows:

$$Z_i = ZC_i \mathbin{/\mkern-6mu/} (ZR_i + ZL_i) = \frac{(sL_i + R_i) \cdot \frac{1}{sC_i}}{\frac{1}{sC_i} + sL_i + R_i}, i = 1, 2, 3 \quad \text{Equation (1)}$$

In Equation (1), $L_i$ stands for the inductance of the inductor, $C_i$ stands for the parasitic capacitance of the real inductor, and $R_i$ stands for the internal resistance of the real inductor.

Please note that the resistor in each of loading units 22, 24, 26 is optional. That is, the added resistor is capable of providing the LNA 100 with a greater gain. Generally speaking, any circuit component is sure to have a parasitic capacitor. If the parasitic capacitance of the inductor is big enough, the combination of the inductor and the capacitor shown in FIG. 2 can be practically implemented by a single inductor. However, if the inductor manufactured by a semiconductor process contributes a small parasitic capacitance to the loading unit 22, 24, 26, the loading unit 22, 24, 26, as shown in FIG. 2, has to include one additional capacitor connected to the inductor in parallel. According to Equation (1), each specific loading unit 22, 24, 26 corresponds to a specific center frequency (i.e., a specific carrier frequency of the communication system) and a specific operating bandwidth based on the 3-dB frequency of the frequency response associated with the impedance of the specific loading unit 22, 24, 26. So, the impedance of each loading unit 22, 24, 26 has a maximum magnitude if the frequency of the input signal is just the same as the selected center frequency. In other words, the LNA 100 provides a maximum gain upon the incoming input signal.

However, the impedance of a loading unit 22, 24, 26 is much smaller if the frequency of the input signal is outside the operating bandwidth. In addition, the gain of the LNA 100 applied to the input signal is smaller than one for attenuating the magnitude of the input signal, which is treated as the undesired noise. The relationship between the impedance and the gain of the LNA 100 is shown as follows:

$$A_v = gm * Z_i, i=1,2,3 \quad \text{Equation (2)}$$

In Equation (2), $A_v$ represents the voltage gain of the LNA 100, and gm represents the transconductance of the NMOS transistor 42 within the voltage to current transformer 40. The operation and functionality of the voltage to current transformer 40 is detailed in the following paragraph.

The voltage to current transformer 40 shown in FIG. 2 is implemented by an n-channel Metal-Oxide Semiconductor (NMOS) transistor 42 and an inductor 44, and is used for transforming the voltage of the input signal $V_{in}$ into a loading current I. As for the ultra-wideband communication system, the carrier frequency is from 10 GHz to 66 GHz, and the magnitude of input signal is quite small. As a result, the maximum transmitted power level is lower than 15 dBm (measured at the antenna port of the transmitter), so it is reasonable to make use of a small signal model of the NMOS 42 to illustrate the operation of the voltage to current transformer 40. In this preferred embodiment, the NMOS 42 is implemented to function as a common gate amplifier, so the relationship between the voltage of the input signal $V_{in}$ and the induced loading current I is shown via the following equation:

$$I = gm * (-V_{in}) \quad \text{Equation (3)}$$

In Equation (3), gm stands for the transconductance of the NMOS 42. According to Equation (3), the output voltage $V_{out}$ of the LNA is equal to the loading current I multiplied by the impedance $Z_i$ provided by an enabled loading unit 22, 24, 26. The relationship is shown as follows:

$$V_{out} = I * Z_i \quad \text{Equation (4)}$$

According to Equations (3) and (4), the voltage gain $A_v$ of the LNA 100 is easily computed via Equation (2). That is, $$A_v = \frac{Vout}{Vin}$$

As for the bias circuit 60, it is a typical current mirror for providing a bias current $I_{bias}$ for the voltage to current transformer 40. Please note that because the current mirror is known to anyone skilled in the art, the description for the bias circuit 60 is omitted for the sake of brevity.

Figure 3:
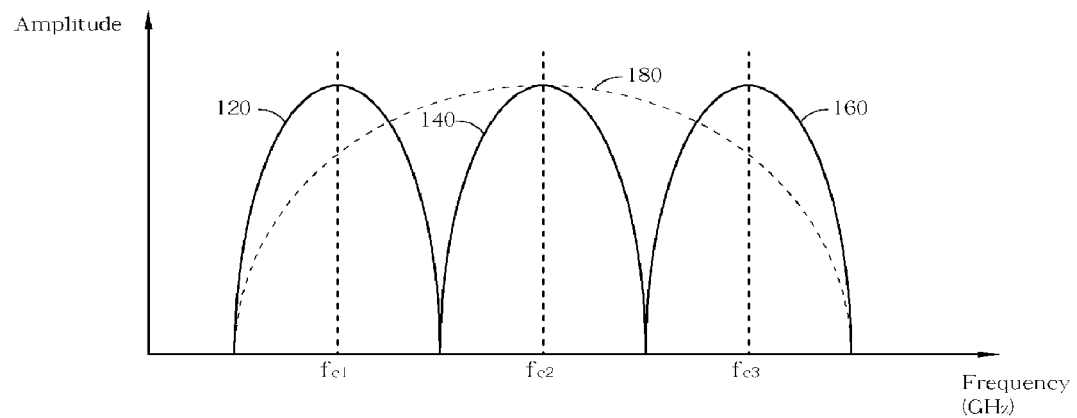
FIG. 3 is a schematic diagram of a frequency response of the low noise amplifier shown in FIG. 2.

Please refer to FIG. 3, which is a schematic diagram illustrating a plurality of frequency responses 120, 140, 160 provided by the LNA 100 shown in FIG. 2. As one can see, the frequency response 120 having a center frequency $f_{c1}$ is formed due to the enabled loading unit 22, the frequency response 140 having a center frequency $f_{c2}$ is formed due to the enabled loading unit 24, and the frequency response 160 having a center frequency $f_{c3}$ is formed due to the enabled loading unit 26. In addition, the frequency response 180 shown in FIG. 3 is a property possessed of the prior art wideband LNA used in the ultra-wideband communication system, wherein the center frequencies $f_{c1}$, $f_{c2}$, $f_{c3}$ correspond to three different carrier frequencies, respectively. In this preferred embodiment, only one of the switches 32, 34, 36 is selectively turned on, so only one of the frequency responses 120, 124, 126 on the spectrum is selected. Therefore, the LNA 100 according to the present invention is capable of switching on another switch when the wideband communication system uses another carrier frequency to deliver data. Instead of adopting a single wide bandwidth to cover these three carrier frequencies, the LNA 100 uses a switched bandwidth to better eliminate the undesired noise. Consequently, the wideband communication system is capable of being more resistive to noise through the LNA 100.

Please note that the number of enabled loading units is not limited to one. That is, the LNA 100 according to the present invention can be properly designed to enable a plurality of loading units at the same time, so these enabled loading units are connected in parallel to provide new impedance $Z_{eq}$ and shift the operating bandwidth of the LNA 100. Assume that two loading units are enabled simultaneously, and the impedance $Z_{eq}$ is shown as follows:

$$Z_{eq} = \frac{Z_1 \cdot Z_2}{Z_1 + Z_2}$$ Equation (5)

In Equation (5), $Z_1$ and $Z_2$ represent the impedance values of two enabled loading units.

Figure 4:
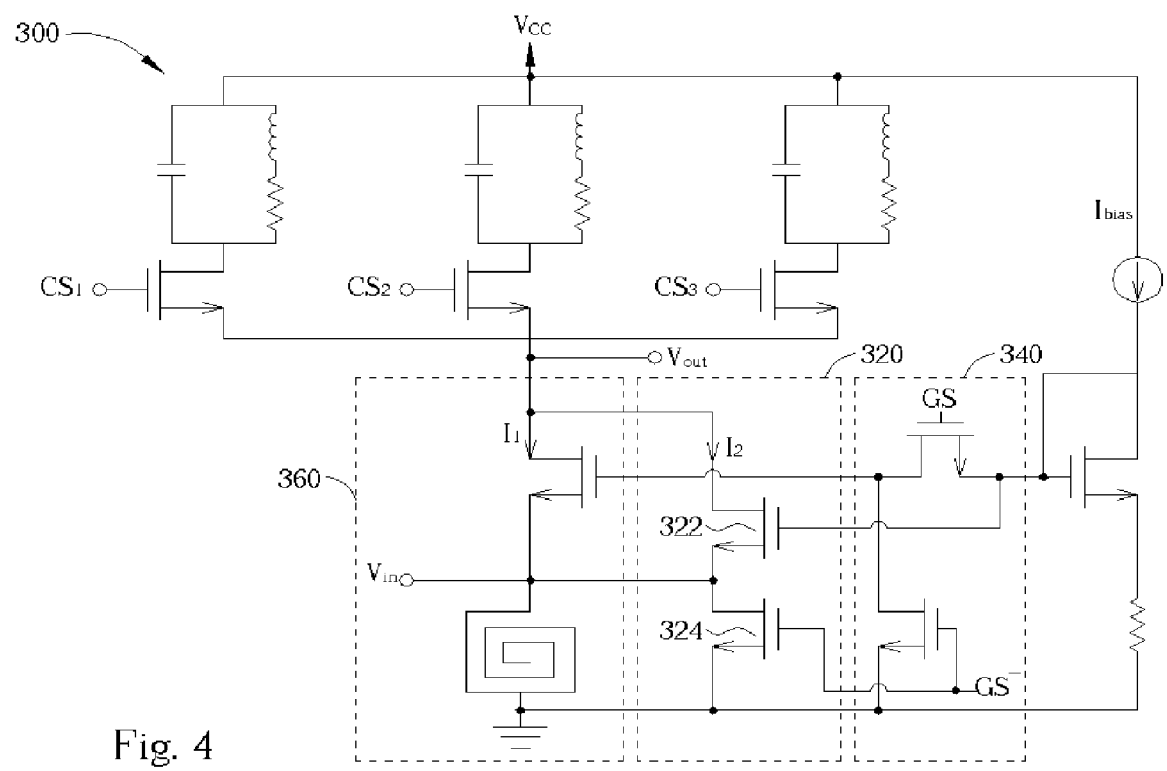
FIG. 4 is a schematic diagram of a low noise amplifier according to another embodiment of the present invention.

Please refer to FIG. 4 which is a schematic diagram of a low noise amplifier (LNA) 300 according to another embodiment of the present invention. The difference between the LNA 300 and the LNA 100 is the LNA 300 can adjust the voltage gain through the voltage to current transformer 320 and the gain controller 340. The gain controller 340 is used to control the voltage to current transformers 360 and 320 according to a desired voltage gain. The voltage to current transformer 320 is implemented by using NMOS transistor 322 and 324. When the maximum voltage gain is adopted, the voltage to current transformer 320 is enabled to convert the voltage of the input signal $V_{in}$ into a loading current $I_2$, and the voltage to current transformer 360 is also able to converting the voltage of the input signal $V_{in}$ into the loading current $I_1$ at the same time as the voltage to current transformer 40 in FIG. 2. That is the voltage to current transformers 360 and 320 provide the LNA 300 with a bigger voltage gain than the LNA 100. However, when a smaller voltage gain is adopted, the NMOS transistor 322 is disabled (i.e., turn off) and the NMOS transistor 324 is enabled (i.e., turn on) at the same time for matching the input impedance to 50 ohms. Therefore, the LNA 300 is able to provide two kinds of voltage gain according the preferred embodiment.

In contrast to the prior art, the LNA according to the present invention selectively enables the appropriate loading unit(s) according to the carrier frequency used by a wideband communication system, that is, the LNA according to the present invention has a plurality of candidate bandwidths, which are narrow bands with specific center frequencies, for amplifying signals transmitted via different carrier frequencies in the wideband communication system. To sum up, with the help of the LNA according to the present invention, the wideband communication system is provided with a better gain characteristic to eliminate the unwanted noise when receiving the input signals with different carrier frequencies.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A low noise amplifier (LNA) for filtering an input signal to generate an output signal, comprising:
    a switched loading circuit comprising a plurality of loading units, each of the loading units determining a corresponding center frequency of the LNA, the switched loading circuit for selectively enabling at least one loading unit having the corresponding center frequency;
    at least one converter coupled to the switched loading circuit for converting the input signal into a loading current and passing the loading current through the enabled loading unit to generate the output signal; and
    a gain controller for controlling the at least one converter according to a desired gain.

2. The LNA of claim 1, wherein the loading units include a first loading unit and a second loading unit, and the switched load circuit further comprises:
    a first switch coupled to the first loading unit and the converter, wherein if the first switch is switched on, the first loading unit is coupled to the at least one converter; and
    a second switch coupled to the second loading unit and the converter, wherein if the second switch is switched on, the second loading unit is coupled to the at least one converter.

3. The LNA of claim 1, wherein each of the loading units comprises an inductor.

4. The LNA of claim 3, wherein each of the loading units further comprises a capacitor coupled to the inductor in parallel.

5. The LNA of claim 4, wherein each of the loading units further comprises a resistor coupled to the inductor in series.

6. The LNA of claim 1, wherein the at least one converter comprises a continued loading unit for adjusting the input impedance to a predetermined value.

7. The LNA of claim 1 being applied to a wideband communication system.

8. A low noise amplifier (LNA) for filtering an input signal to generate an output signal, comprising:
    a switched loading circuit comprising a plurality of loading units, each of the loading units determining a corresponding center frequency, the switched loading circuit for selectively enabling at least one loading unit;
    a first converter coupled to the switched loading circuit for converting the input signal into a first loading current; and
    a second converter coupled to the switched loading circuit for converting the input signal into a second loading current;
    wherein the output signal is generated according to the first loading current or the second loading current or both.

9. The LNA of claim 8, wherein the loading unit is enabling according to the operation situation of the first and the second converters.

10. The LNA of claim 8, further comprising:
    a controlled loading unit for adjusting the input impedance of the LNA to a predetermined value.

11. The LNA of claim 8, further comprising:
    a gain controller for driving the first and the second converters according to a desired gain.

12. A low noise amplifying method for filtering an input signal to generate an output signal, comprising:
    providing a plurality of loading units, each of the loading units determining a corresponding center frequency;
    selectively enabling at least one loading unit; and
    converting the input signal into a loading current and passing the loading current through the enabled loading unit to generate the output signal; and
    converting the input signal into a second loading current and passing the second loading current through the enabled loading unit according to a desired gain to generate the output signal.

13. The method of claim 12, wherein the loading units include a first loading unit and a second loading unit, and the step of selectively enabling comprises:
    providing a first switch and a second switch;
    switching on the first switch to enable the first loading unit; and
    switching on the second switch to enable the second loading unit.

14. The method of 12, wherein each of the loading units comprises an inductor.

15. The method of claim 14, wherein each of the loading units further comprises a capacitor coupled to the inductor in parallel.

16. The method of claim 15, wherein each of the loading units further comprises a resistor coupled to the inductor in series.

17. The method of claim 12 further comprising: controlling a controlled loading unit to match the input impedance to a predetermined value.

18. The method of claim 12 being applied to a wideband communication system.

19. A low noise amplifier (LNA) for filtering an input signal to generate an output signal, comprising:
a switched loading circuit comprising a plurality of loading units, each of the loading units determining a corresponding center frequency of the LNA, the switched loading circuit for selectively enabling at least one loading unit having the corresponding center frequency; and
at least one converter coupled to the switched loading circuit for converting the input signal into a loading current and passing the loading current through the enabled loading unit to generate the output signal;
wherein each of the loading units comprises:
an inductor;
a capacitor coupled to the inductor in parallel; and
a resistor coupled to the inductor in series.

20. The LNA claim 19, the at least one converter comprises a controlled loading unit for adjusting the input impedance to a predetermined value.

21. The LNA of claim 19, further comprising:
a gain controller for driving the first and the second converters according to a desired gain.

22. A low noise amplifying method for filtering an input signal to generate an output signal comprising:
providing a plurality of loading units, each of the loading units determining a corresponding center frequency;
selectively enabling at least one loading unit;
converting the input signal into a loading current and passing the loading current through the enabled loading unit to generate the output signal; and
wherein each of the loading units comprises:
an inductor;
a capacitor coupled to the inductor in parallel; and
a resistor coupled to the inductor in series.

23. The method of claim 22, wherein the loading units include a first loading unit and a second loading unit, and the step of selectively enabling comprises:
providing a first switch and a second switch;
switching on the first switch to enable the first loading unit; and
switching on the second switch to enable the second loading unit.

24. The method of claim 22 further comprising:
converting the input signal into a second loading current and passing the second loading current through the enabled loading unit according to a desired gain to generate the output signal.

25. A low noise amplifying method for filtering an input signal to generate an output signal, comprising:
providing a plurality of loading units, each of the loading units determining a corresponding center frequency;
selectively enabling at least one loading unit;
converting the input signal into a loading current and passing the loading current through the enabled loading unit to generate the output signal; and
converting the input signal into a second loading current and passing the second loading current through the enabled loading unit according to a desired gain to generate the output signal.

26. A low noise amplifier (LNA) for filtering an input signal to generate an output signal, comprising:
a switched loading circuit comprising a plurality of loading units, each of the loading units determining a corresponding center frequency of the LNA, the switched loading circuit for selectively enabling at least one loading unit; and
at least one converter coupled to the switched loading circuit for converting the input signal into a loading current and passing the loading current through the enabled loading unit to generate the output signal;
wherein the converter comprises:
a transistor, and
an inductor coupled to the transistor in series.

27. The LNA of claim 26, wherein the at least one converter comprises a controlled loading unit for adjusting the input impedance to a predetermined value.

28. The LNA of claim 26, further comprising:
a gain controller for driving the first and the second converters according to a desired gain.

* * * * *